(12) United States Patent
Larsson

(10) Patent No.: US 6,344,772 B1
(45) Date of Patent: Feb. 5, 2002

(54) APPARATUS AND METHOD FOR CAPACITANCE MULTIPLICATION

(75) Inventor: Patrik Larsson, Matawan, NJ (US)

(73) Assignee: Agere Systems Guardian Corp, Orlando, FL (US)

(*) Notice: Subject to any disclaimer, the term of this patent is extended or adjusted under 35 U.S.C. 154(b) by 0 days.

(21) Appl. No.: 09/587,950

(22) Filed: Jun. 6, 2000

(51) Int. Cl.[7] .............................. H03B 1/00
(52) U.S. Cl. ............................... 327/552
(58) Field of Search ............... 327/551, 552, 327/553, 556, 557, 558, 559, 560, 561, 562, 563

(56) References Cited

U.S. PATENT DOCUMENTS 5,382,918 A * 1/1995 Yamatake .................. 330/260
6,201,438 B1 * 3/2001 Nicollini et al. ............ 327/558

* cited by examiner

Primary Examiner—Jeffrey Zweizig
(74) Attorney, Agent, or Firm—Henry I. Schanzer, Esq

(57) ABSTRACT

A capacitance multiplier network embodying the invention includes a first resistor, R1, connected between a first node and an intermediate node and a first capacitor, C1, connected between the intermediate node and a point of reference potential. A unity gain amplifier has an input connected to the intermediate node and its output is connected via a second resistor, R2, to the first node. The unity gain amplifier ensures that the voltage drop across the second resistor is equal to the voltage drop across the first resistor. The effective capacitance, Ce, of the network is equal to C1 times [R1+R2]/R2. Thus, by making R1 larger than R2, Ce is much large than the capacitance of C1. The capacitance multiplier network is well suited for use in phase locked loop circuits and enables the integration of a very dense circuit on the same IC chip.

18 Claims, 5 Drawing Sheets

APPARATUS AND METHOD FOR CAPACITANCE MULTIPLICATION

BACKGROUND OF THE INVENTION

This invention relates to apparatus and methods for realizing large values of capacitance using small valued capacitors.

In many circuits it is required and/or necessary to have large values of capacitance. However, to produce large values of capacitance in, and on, an integrated circuit (IC) normally requires that an unduly large portion of the available area of the IC chip be devoted to the capacitor. This presents a problem where it is desired and/or necessary to manufacture most, if not all, of the components of a complex circuit on the same IC chip to meet, among others, requirements for greater reliability, better component matching and lower noise.

A possible solution to the problem of insufficient on-chip capacitance may include the use of a known capacitance multiplication circuit 50 as shown in FIG. 1. The circuit 50 includes a capacitor C1 connected between nodes 142 and 143. The capacitance of C1 is effectively increased by means of amplifying the signal at node 142 (one side of C1) and supplying an amplified signal at node 143 (the other side of C1), whereby the effective capacitance of C1 is increased. The circuit 50 includes a buffering unity gain amplifier A11 connected at its input to node 142 and at its output to an input 152 of amplifier 51. Amplifier 51 includes a resistor R10 connected between input terminal 152 and an inverting input 153 of an operational amplifier A12. A feedback resistor R20 is connected between the output of A12 and inverting input 153. The gain, K, of amplifier 51 is substantially equal to R20/R10; with R20 selected to be greater than R10. The output of amplifier 51 is connected to node 143. Due to the amplification of amplifier 51, the effective capacitance of C1 at node 142 is multiplied by a factor of (1+K), whereby the effective capacitance at node 142 is equal to (1+K)(C1).

However, the circuit of FIG. 1 suffers from certain significant problems. One problem is that the amplifiers, in particular operational amplifier A12, requires a large dynamic range. This may be illustrated by noting that if: (a) the input signal has a dynamic range between zero and 1 volt, and (b) a capacitance multiplication factor of 10 is desired, then amplifier A12 must have a gain of 10 and a dynamic range between 0 and 10 volts. But, in integrated circuits operated at a power supply (operating) voltage between 1 and 5 volts, a dynamic range in excess of the power supply voltage can not be achieved. Another problem is that the gain bandwidth product of amplifier A12 has to be K times the bandwidth of the input signal. Where the bandwidth of the input signal is in the range of 5 MHz, and K is 10, the gain bandwidth of amplifier A12 would have to be in the range of 50 MHz. This high gain bandwidth product can normally be achieved only at the cost of significant power dissipation. This is a significant disadvantage in the manufacture of high density integrated circuits (ICs). Therefore, the prior art scheme for increasing the effective capacitance, just described, as well as other known schemes relying on the Miller effect to increase capacitance are not well suited for integrated circuits having small operating voltages and where low power dissipation is desired.

SUMMARY OF THE INVENTION

In circuits embodying the invention, the capacitance, C, of a capacitor is effectively increased by controlling the division of a signal current between a first path including the capacitor for carrying 1/X of the signal current and a second path for carrying the remainder (1−1/X) of the signal current; where X is normally greater than 2. A unity gain amplifier, having an input and an output, is connected at its input to the first path and at its output to the second path to ensure the continued division of the signal current, whereby the signal sees an effective capacitance which is approximately equal to C times (X).

In a particular embodiment a signal current, I, is supplied to a first node. The first path includes a first resistor (R1) connected between the first node and an intermediate node, and a first capacitor (C1) connected between the intermediate node and a point of reference potential. A unity gain amplifier has an input connected to the intermediate node and has an output at which it produces an output voltage equal to the one at the intermediate node. The second path includes a second resistor (R2) connected between the first node and the output of the unity gain amplifier, whereby the voltage drop across R1 is equal to the voltage drop across R2. For this circuit configuration, the effective value of the capacitor is equal to (C1)(1+R1/R2). Accordingly, C1 will be multiplied by the extent to which R1 is made larger then R2. In integrated circuits, resistors R1 and R2 can be made to have a wide range of values and the ratio of R1 to R2 can be readily controlled. Thus large effective values of capacitance, not readily formed in integrated circuit, may be obtained from small capacitors which are easily and readily formed in integrated circuits.

The capacitance multiplying network of the invention is well suited for use as a filter in many different system and circuit applications. For example, in a phase locked loop (PLL) circuit, a capacitance multiplying network may be advantageously connected to the output of a charge pump circuit for controlling the voltage applied to a voltage controlled oscillator (VCO).

BRIEF DESCRIPTION OF THE DRAWINGS

In the accompanying drawings like reference characters denote like components.

DETAILED DESCRIPTION OF THE INVENTION

Figure 1:
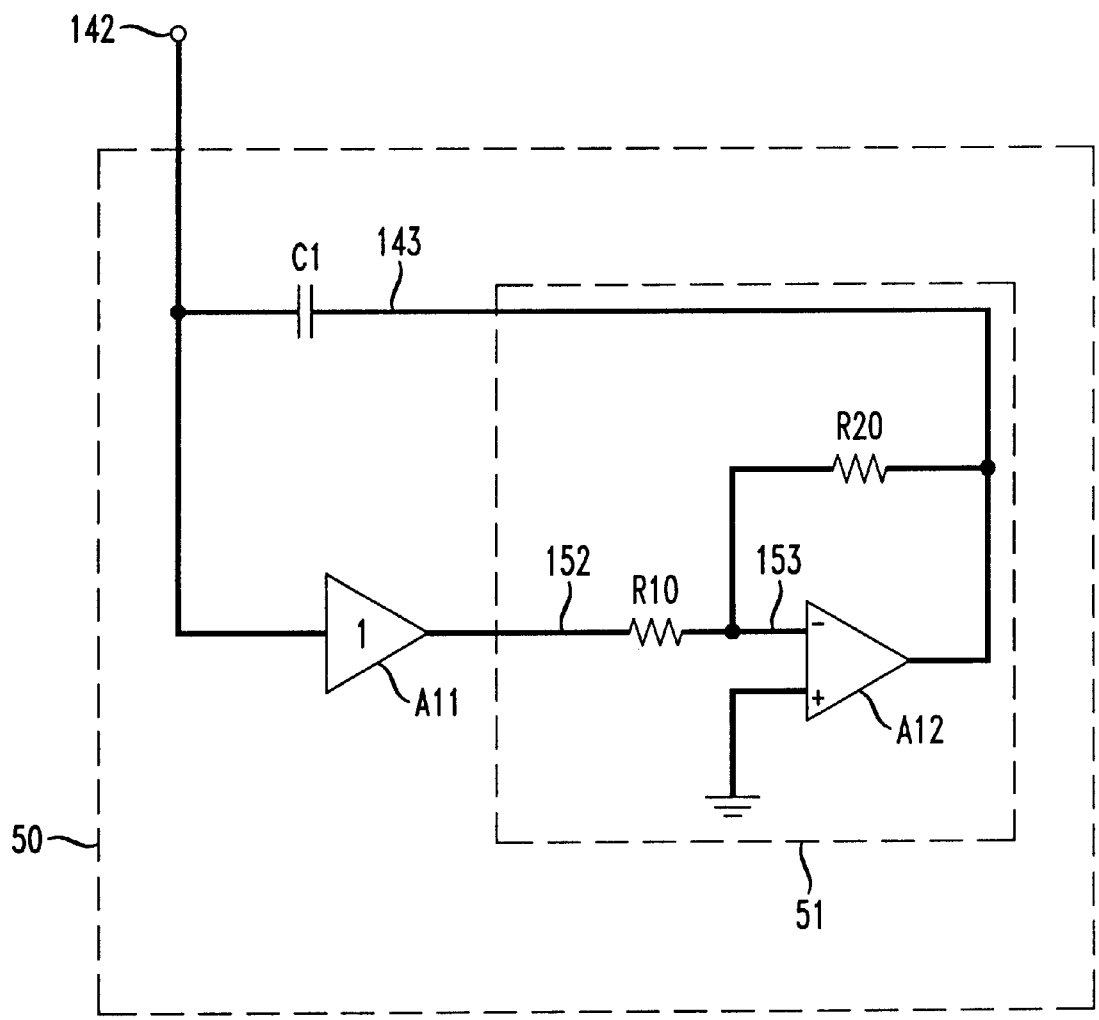
FIG. 1 is a schematic diagram of a prior art capacitance multiplier circuit.
Figure 2:
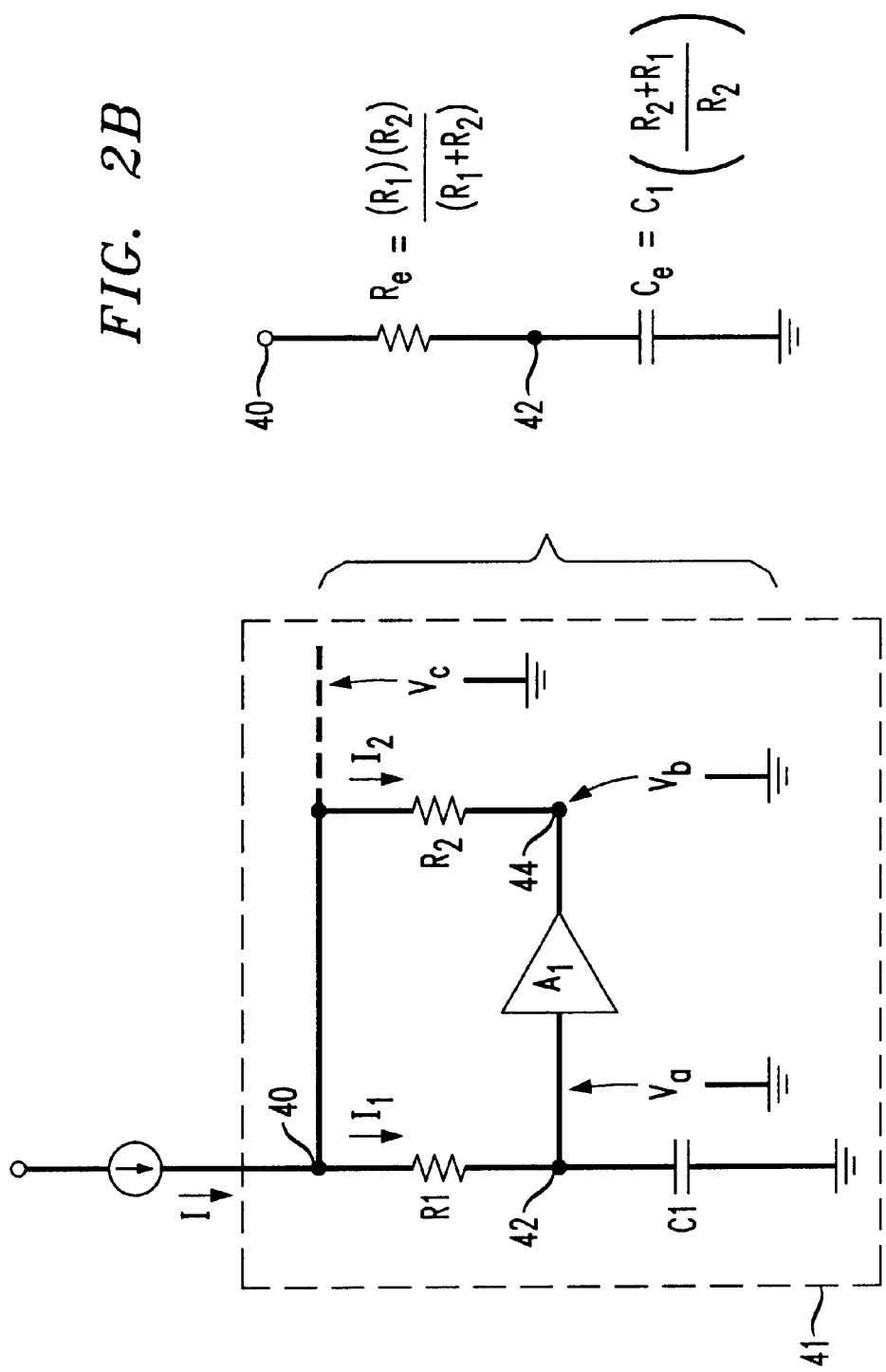
FIG. 2A is a schematic diagram of a capacitance multiplier network in accordance with the invention.
FIG. 2B is the equivalent of the circuit of FIG. 2A.

Referring to FIG. 2A there is shown a filter network 41 which includes a capacitance multiplying circuit embodying the invention. The filter 41 includes: (a) a first resistor R1 connected between a node 40 and an intermediate node 42; (b) a capacitor, C1, connected between node 42 and a point of reference potential (e.g.,ground); (c) a unity gain amplifier A1 having a signal input terminal connected to node 42 and a signal output terminal connected to an output node 44; and (d) a second resistor R2 connected between nodes 40 and 44. As further discussed below, amplifier A1 may be operated with a power supply whose operating voltage ranges from 1–5 volts.

The operation of filter 41 and the capacitance multiplication of the network may be explained as follows. A signal current, I, flows into node 40. The signal current, I, is divided into two paths; one path carrying a current I1, and the other path carrying a current I2. The current, I1, flows through resistor R1 and capacitor C1 and the second current I2 flows through resistor R2 and into the output terminal of amplifier A1. It is assumed that the input impedance of amplifier A1 is very large and that essentially no current flows into the input of A1.

The signal current, I, is therefore equal to the current I1 plus the current I2. That is:

$$I = I1 + I2 \qquad \text{EQ. 1}$$

The impedance, Z, presented by the filter at node 40 may be expressed as follows:

$$Z = V/I = V/[I1+I2] \qquad \text{EQ. 2}$$

Where I1 and I2 are the currents through R1 and R2, respectively, and V is the voltage at node 40.

The current, I1, flowing through R1 and C1 may be expressed as follows:

$$I1 = V/[R1 + 1/sC1] \qquad \text{EQ. 3}$$

The voltage drop across R1 is equal to (R1)(I1)=(R1)(V/[R1+1/sC1]).

The unity gain amplifier A1 causes the voltage (Vb), at its output terminal 44, to be equal to the voltage (Va) at its input terminal 42; i.e., Va is always equal to Vb. Thus, the end of R1 connected to the input of A1 is at the same voltage as the end of R2 connected to the output of A1. Consequently, since R1 and R2 are connected, at one end, in common at node 40 and since their other ends are at the same voltage, it follows that the voltage drop across R2 is equal to the voltage drop across R1. Therefore, the relationship of the currents through R1 and R2 is as follows:

$$(I1)(R1) = (I2)(R2) \qquad \text{EQ. 4}$$

from which it follows that:

$$I2 = [(I1)(R1)]/R2 \qquad \text{EQ. 5}$$

Since I=I1+I2, replacing the value of I2 from EQ. 5 into equation 1 produces the following:

$$I = I1 + I2 = I1 + [(I1)(R1)]/R2 = I1[1+R1/R2] = I1(X) \qquad \text{EQ. 6}$$

Then, substituting the value of I1 from eq. 3 into EQ. 6 produces the following:

$$I = (V/[R1+1/sC1])([1+R1/R2]) = [(V)(1+R1/R2)]/[R1+1/sC1] \qquad \text{EQ. 7}$$

Substituting the value of I from equation 7 into equation 2, which defines the impedance of the network at node 40, yields the following:

$$Z = V/I = [R1+1/sC1]/(1+R1/R2) \qquad \text{EQ. 8A}$$

Equation 8A may be rewritten as follows $$Z = V/I = [(R1)(R2)]/(R1+R2)] + 1/[(sC1)(1+R1/R2)] \qquad \text{EQ. 8}$$

Analysis of the impedance terms in EQ. 8 indicates that the impedance Z of filter 41 is equal to an effective resistor Re in series with an effective capacitor Ce, as shown in FIG. 2B; where:

$$Re \text{ is equal to } [(R1)(R2)]/[R1+R2] \qquad \text{EQ. 9}$$

and $$Ce \text{ is equal to } (C1)(1+R1/R2). \qquad \text{EQ. 10}$$

The effective (or equivalent) capacitance Ce is thus equal to C1 multiplied by the ratio of (1+R1/R2). It is significant that the capacitance C1 is multiplied by the same ratio (i.e., 1+R1/R2) by which I1 is multiplied in EQ. 6, above. Thus, in a circuit embodying the invention, a small portion (1/X)of the signal current (Is) flows through a first path (e.g., R1–C1) and a unity gain amplifier A1 is used to cause an amplified current which is equal to the balance of the signal current [i.e., Is(1−1/X)] to pass through a second path (e.g.,R2). By selecting R1 to be much greater than R2, the equivalent capacitor Ce is much larger than the actual capacitor C1. For example, if R1 is made equal to 20k ohms and R2 is made equal to 1k ohms, the effective capacitance of Ce is 21 time the capacitance of C1. For this example, an actual capacitor formed to have a value of 500 pF would provide an effective (or equivalent) capacitance of approximately 10 nF. This is a very significant result in the manufacture of integrated circuits. Whereas to it would be difficult, if not impossible, to form a 10 nF capacitor on a "dense" IC chip containing circuitry requiring high capacitance, forming a 500 pF capacitor on the "dense" IC is quite feasible.

The circuit of FIG. 2A avoids the dynamic range problem present in the prior art. Since there is no amplification of the voltage signals. Also, the unity gain amplifier of FIG. 2A does not have to operate over the large gain-bandwidth product required in the prior art amplifiers. Still further, the circuit of FIG. 2A implements an RC network which is highly suitable for phase locked loop (PLL) applications, as illustrated in FIG. 3.

Figure 3:
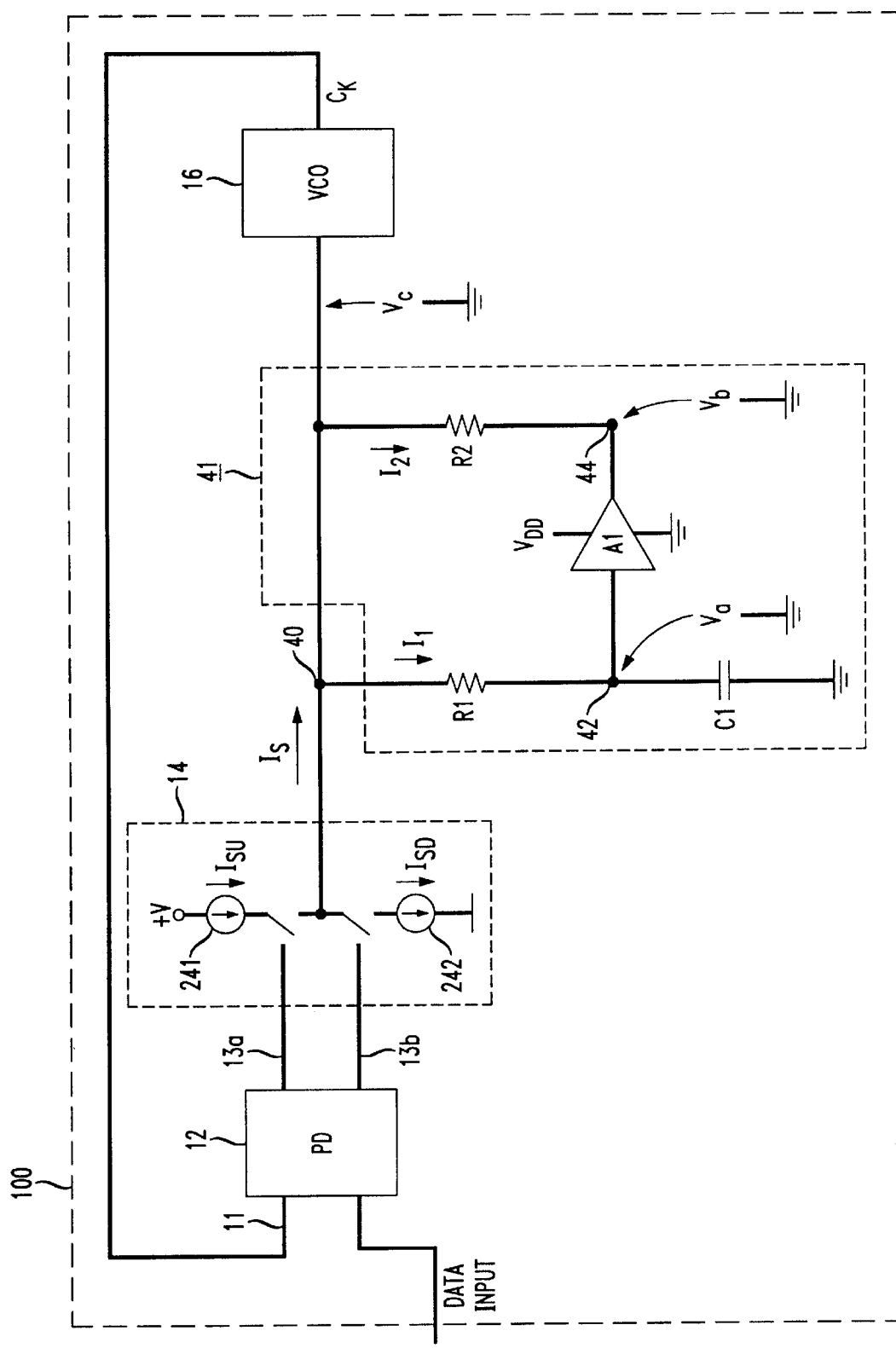
FIG. 3 is a schematic diagram of a portion of a PLL circuit including a filter network embodying the invention.
Figure 4:
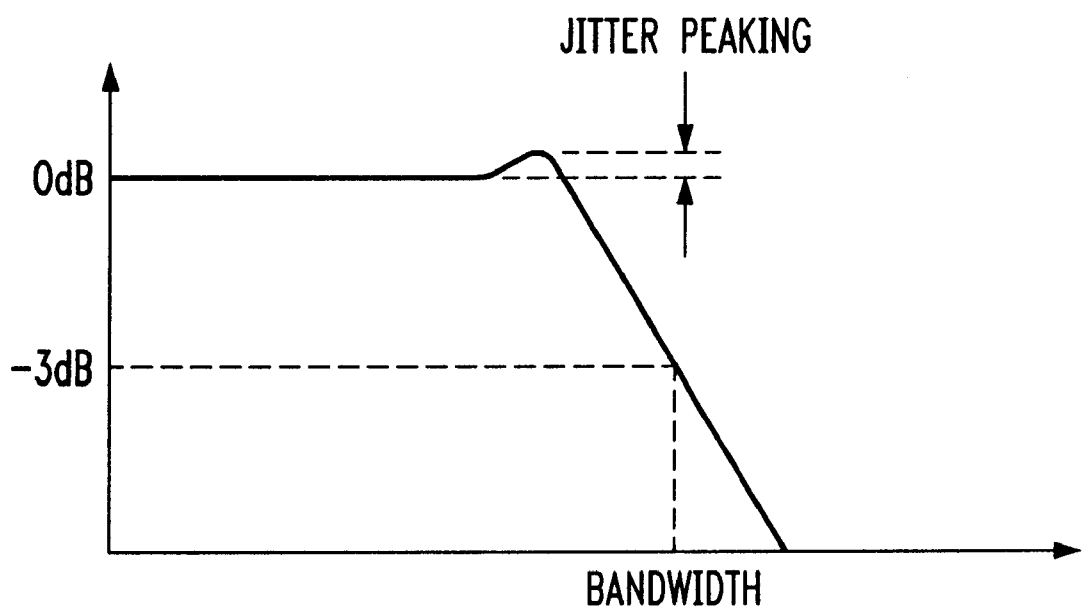
FIG. 4 is a diagram of the frequency response of the PLL of FIG. 1.

FIG. 3 is an example of a phase locked loop (PLL) clock recovery circuit with which a capacitor multiplier network 41 embodying the invention may be advantageously operated. The PLL includes a phase detector (PD) circuit 12 having a data input, 9, and a clock (Ck) recovery input, 11, and having an output 13a, 13b at which is produced a signal indicative of the phase difference between the data input and the clock recovery signals. The output 13a, 13b of PD 12 is applied to the input of a charge pump circuit 14 producing a pump (signal) current, Is, which flows into a node 40. By way of example, the charge pump 14 may include a source of current 241, responsive to output 13a, which supplies a "sourcing" signal current, Isu, into node 40 and a current sink 242, responsive to output 13b, which draws ("sinks") a signal current, Isd, out of node 40. In practice, any suitable charge pump circuit may be used. A control voltage, Vc, is developed at node 40 which is applied to the input of a voltage controlled oscillator (VCO) 16 at whose output is produced a clock recovery signal, Ck, which is fed back to input 11 of PD 12. The bandwidth of the PLL may have a frequency response of the type shown in FIG. 4. However, the circuit exhibits "jitter peaking" as shown in FIG. 4. To reduce the "jitter peaking" a filter network having a relatively large value of capacitance is preferably connected to node 40, which is connected to the output of the charge pump 14. Accordingly, a loop filter network 41 embodying the invention is connected to node 40 which is common to the output of charge pump circuit 14 and the input node of VCO 16.

It is highly desirable to integrate (form) all the components of the PLL shown in FIG. 3 on a single integrated circuit (IC) to avoid the injection of noise onto the sensitive node 40 at the VCO input. Noise on node 40 affects the performance of the circuit adversely in terms of bit error rate (BER). However, in the absence of a filter circuit embodying the invention, it is found that the value of C, selected to give sufficient damping to maintain "jitter peaking" within specified limits, is too large to integrate on chip. In the absence of the invention, to provide the selected value of capacitance, off chip components are required which results in poor noise performance. Thus, using a filter circuit embodying the invention the effective capacitance, Ce, of the filter network is equal to (C1)(R1+R2/R2).

Thus loop filter 41 which includes a capacitance multiplying network connected to the output of charge pump 14 at node 40 is suitable for use in a PLL type circuit of the type shown in FIG. 3 and permits the entire circuit shown in FIG. 3 to be manufactured on a single IC 100. Furthermore, in the circuit of FIG. 3, PD 12, charge pump 14, VCO 16 and amplifier A1 may all be operated with a power supply voltage designed for the IC 100 and whose operating voltage ranges from 1–5 volts.

It is assumed that the respective input impedance of amplifier A1 and of VCO 16 are very high and that essentially no current flows into the input of VCO 16 from node 40 and into the input of A1 from node 42.

Figure 5:
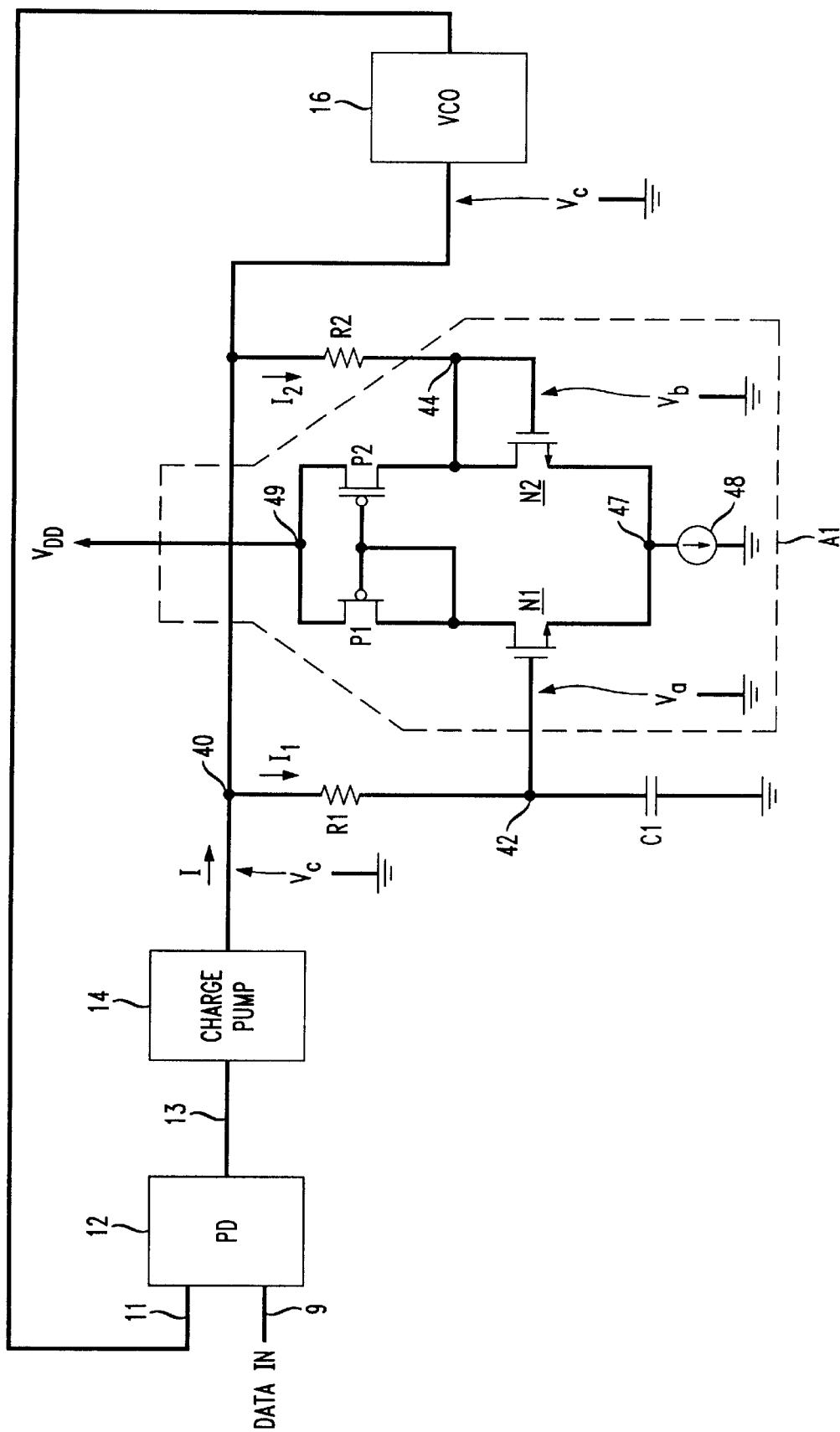
FIG. 5 is a more detailed schematic diagram of a circuit embodying the invention.

The unity gain amplifier A1 of FIGS. 2A and 3 may be implemented, for example, as shown in FIG. 5. In FIG. 5, the unit gain amplifier A1 includes two N-type insulated gate field effect transistors (IGFETs) which are differentially connected. The gate of N1 is connected to node 42, which functions as the input signal terminal of the amplifier and the gate of N2 is connected to node 44 which functions as the signal output terminal of the amplifier. The source electrodes of IGFETs N1 and N2 are connected in common to a node 47. A current source 48 is connected between node 47 and ground (e.g., a reference) potential. The source-to-drain path of a P-type IGFET, P1, is connected between the power terminal 49 and the drain of N1. The source of a P-type IGFET, P2, is connected to power terminal 49 and the drain of P2 is connected to the drain and the gate of N2 at output node 44. The gates of P1 and P2 are returned to the drain of N1. Resistor R1 is connected between nodes 40 and 42, and capacitor C1 is connected between node 42 and ground terminal. Since gate impedance of IGFET N1 is very high, it may be assumed that no current flows into the gate of N1. It is evident from FIG. 5 that the current I flowing from charge pump 14 into node 40 is divided into two paths. One path is defined by resistor R1 and capacitor C1 and will pass a current I1 between node 40 and ground. The other path is defined by resistor R2 connected between node 40 and the output (node 44) of the amplifier and will pass a current I2. As before it is assumed that the signal current I is equal to I1 plus I2. For the configuration shown in FIG. 5, the gates of N1 and N2 will always be at substantially the same voltage. Accordingly, the voltage across R1 will equal the voltage across R2. By making R1 much larger than R2, the current division is such that most of the signal current I flows in the I2path. However, due to amplifier A1, it is the current through R1 and C1 which determines the amplitude and variations of I2. Hence, I2 may be viewed as an amplified (and mirrored) version of the current through C1. Therefore as demonstrated above, the capacitance of C1 is effectively increased (multiplied) as a function of the ration of the resistors R1 and R2, which determine the ratio of the currents flowing through their respective paths. Thus, it has been shown that a small capacitor may be used to realize a much larger capacitance.

Splitting the resistance of an RC network, by making R much larger you can make C much smaller to get the same time constant, by keeping C the same you increase the time constant by splitting the resistance and using a unity gain amplifier, the net effect of the capacitance is multiplied by the ratio of resistors.

The invention has been illustrated using a filter network in a PLL system. However, it should be understood that filter circuits embodying the invention may take different forms and may be used in many different applications.

What is claimed is:

1. A filter comprising:
    a first resistor connected between a first node and an intermediate node;
    a first capacitor connected between said intermediate node and a point of reference potential;
    a unity gain amplifier having an input connected to said intermediate node and having an output; and
    a second resistor connected between said first node and said output of said unity gain amplifier.

2. A filter as claimed in claim 1, wherein the resistance of said first resistor is larger than the resistance of said second resistor.

3. A filter as claimed in claim 1, wherein said unity gain amplifier has a high input impedance.

4. A filter as claimed in claim 1, wherein all the components are suitable to be formed on the same integrated circuit.

5. A filter as claimed in claim 1, wherein said unity gain amplifier includes a differential input stage comprised of insulated gate field effect transistors (IGFETs), the gate of a first IGET being connected to said intermediate node and the gate of a second IGFET being connected to said output.

6. A filter as claimed in claim 1, wherein said first and second resistors, said first capacitor and said unity gain amplifier are all formed on the same integrated circuit (IC).

7. A filter as claimed in claim 1, wherein for a current, I, flowing into said node and a corresponding voltage, V, developed at said node, the impedance between the first node and the point of reference potential is Z=V/I; where Z is equal to an effective resistance, Re, in series with an effective capacitance, Ce; where Re is equal to [(R1)(R2)]/[R1+R2] and Ce is equal to (C1)(1+R1/R2); and where R1 and R2 represent the respective ohmic values of the first and second resistors, and C1 represents the capacitance of the first capacitor.

8. A filter as claimed in claim 7, wherein said filter is formed on an integrated circuit, with said first and second resistors being integrated resistors and said first capacitor being an integrated capacitor all formed on the same integrated circuit.

9. A combination comprising:
    circuitry for supplying a signal current, I, to a first node;
    a first resistor connected between said first node and an intermediate node;
    a first capacitor connected between said intermediate node and a point of reference potential;
    a unity gain amplifier having an input connected to said intermediate node and having an output; and
    a second resistor connected between said first node and said output of said unity gain amplifier.

10. A combination as claimed in claim 9 wherein said circuitry for supplying a signal current to said first node includes a charge pump circuit having an output coupled to said first node; and wherein said circuitry further includes a voltage controlled oscillator (VCO) having a high impedance input connected to said first node and having an output at which is produced a clock signal whose frequency is a function of the voltage at the first node, and wherein said circuitry further includes a phase detector having an input to which is applied the output of the VCO and a data input signal, the phase detector having an output at which is produced a signal responsive to differences in the signals applied to its input, and wherein said output of said phase detector supplies control signals to the charge pump circuit causing its output current to change.

11. A combination as claimed in claim 10, wherein the entire combination is formed on the same integrated circuit.

12. A combination comprising:
   a first current carrying path connected between an input node for the application thereto of a signal current, Is, and a point of reference potential for passing 1/X of the current Is; where X is larger than 2; said first path including a capacitor connected between an intermediate node along the first path and said point of reference potential;
   a unity gain amplifier having a signal input terminal and a signal output terminal; said amplifier being connected at its signal input terminal to said intermediate node; and
   a second current carrying path connected between said input node and the signal output terminal of said amplifier for passing the remainder of the current Is.

13. A combination as claimed in claim 12, wherein the current I1 in the first path is equal to Is/X and the current, I2, in the second path is equal to Is(1−1/X).

14. A combination as claimed in claim 12 wherein capacitance of the capacitor is equal to C1 and wherein the effective capacitance at the intermediate node is equal to (C1)(X).

15. A combination as claimed in claim 12 wherein the first current carrying path includes a first resistor, R1, connected between the input and the intermediate nodes and the capacitor C1 connected between the intermediate node and the point of reference potential; and wherein the second current carrying path includes a second resistor, R2, connected between the input node and the signal output terminal of the unity gain amplifier, whereby the voltage drop across the second resistor is kept equal to the voltage drop across the first resistor.

16. A method for multiplying the capacitance of a capacitor, C1, by a factor X, where X is a number greater than one, comprising the steps of:
   connecting a first resistor between a first node and an intermediate node;
   connecting said capacitor, C1, between the intermediate node and a point of reference potential;
   connecting an input of a unity gain amplifier to the intermediate node;
   connecting a second resistor between the first node and an output of the amplifier; and
   selecting the resistance of the first and second resistors such that X is equal to [R1+R2]/R2.

17. A capacitance multiplying circuit comprising:
   circuitry for supplying a signal current, I, into a first node;
   a first current carrying path connected between said first node and a point of reference potential for carrying I/X of the current I; said current carrying path including a first resistor, R1, connected in series with a capacitor C1; and
   means responsive to the current in said first path for passing the remainder of the signal current flowing into said first node along a second path, whereby the effective capacitance at the first node is equal to C1 times X; where X is a number greater than one.

18. A capacitance multiplying circuit as claimed in claim 17, wherein said first resistor is connected between said first node and an intermediate node; and wherein said means responsive to the current in said first path includes a unity gain amplifier having an input and an output and a second resistor; wherein the input of said unity gain amplifier is connected to said intermediate node, and wherein the second resistor is connected between the first node and the output of the unity gain amplifier; and wherein X is equal to [R1+R2]/R2.

* * * * *